United States Patent
Chuang et al.

(10) Patent No.: US 7,534,671 B2
(45) Date of Patent: May 19, 2009

(54) METHOD FOR INTEGRALLY FORMING AN ELECTRICAL FUSE DEVICE AND A MOS TRANSISTOR

(75) Inventors: Chiang-Ming Chuang, Hemei Changhua (TW); Liang-Kai Han, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/058,664

(22) Filed: Mar. 29, 2008

(65) Prior Publication Data

US 2008/0182373 A1    Jul. 31, 2008

(51) Int. Cl.
*H01L 21/338* (2006.01)
*H01L 21/336* (2006.01)
(52) U.S. Cl. ........................ 438/171; 438/281
(58) Field of Classification Search ......... 438/131–132, 438/171, 281
See application file for complete search history.

(56) References Cited

U.S. PATENT DOCUMENTS

| 7,422,956 B2 * | 9/2008 | Waite et al. ................. 438/406 |
| 7,422,972 B2 * | 9/2008 | Babcock et al. ............. 438/601 |
| 7,425,472 B2 * | 9/2008 | Marr ........................ 438/132 |

* cited by examiner

*Primary Examiner*—Cuong Q Nguyen
(74) *Attorney, Agent, or Firm*—K & L Gates LLP

(57) ABSTRACT

A method for integrally forming a metal-oxide-semiconductor (MOS) device and an electrical fuse device on a semiconductor substrate includes the following steps. An isolation structure is formed on the semiconductor substrate. A dielectric layer is deposited over the isolation structure and the semiconductor substrate. A metal layer is deposited on the dielectric layer. A polysilicon layer is deposited on the metal layer. The dielectric layer, the metal layer and the polysilicon layer are patterned into a first stack of the dielectric layer, the metal layer and the polysilicon layer on the isolation structure for functioning as the electrical fuse device, and a second stack of the dielectric layer, the metal layer and the polysilicon layer on the semiconductor substrate for functioning as a gate of the MOS device.

14 Claims, 3 Drawing Sheets

US 7,534,671 B2

METHOD FOR INTEGRALLY FORMING AN ELECTRICAL FUSE DEVICE AND A MOS TRANSISTOR

This application is related to and claims priority to allowed U.S. patent application Ser. No. 11/388,086, filed Mar. 23, 2006 entitled "METHOD FOR INTEGRALLY FORMING AN ELECTRICAL FUSE DEVICE AND A MOS TRANSISTOR" which is incorporated by reference herein.

BACKGROUND

The present invention relates generally to semiconductor processing technology, and more particularly to a method for integrally forming an electrical fuse device and a metal-oxide-semiconductor (MOS) device.

An electrical fuse is a device put in a circuit as a fusable link to protect against overloading. Current above a predetermined threshold will melt the fuse and cause an open circuit. Various mechanisms can be used to program the electrical fuse device. There are three mechanisms commonly used in programming the electrical fuse device, namely, electromigration effect, silicide agglomeration and rupture. Given a certain programming current and time, the resistance of the electrical fuse can be adjusted by utilizing these mechanisms.

Conventionally, the electrical fuse device is constructed by depositing and patterning a polysilicon layer on an isolation structure separating the same from its underlying semiconductor substrate. The polysilicon layer usually comes from the same layer that is used to form the poly gate of a MOS device. This allows the electrical fuse device and the MOS device to be constructed in the same series of processing steps.

As the semiconductor manufacturing technology advances, it becomes increasingly popular that the MOS device would include a metal structure in its gate electrode. This poses a new challenge to the construction of the electrical fuse device. If separate processing steps are used to construct the MOS device and the electrical fuse device, the fabrication costs will increase. As such, it is desirable to have a method for forming an electrical fuse device and the MOS device with a metal gate structure integrally.

SUMMARY

The invention discloses a method for integrally forming a metal-oxide-semiconductor (MOS) device and an electrical fuse device on a semiconductor substrate. In one embodiment of the invention, the method includes the following steps. An isolation structure is formed on the semiconductor substrate. A dielectric layer is deposited over the isolation structure and the semiconductor substrate. A metal layer is deposited on the dielectric layer. A polysilicon layer is deposited on the metal layer. The dielectric layer, the metal layer and the polysilicon layer are patterned into a first stack of the dielectric layer, the metal layer and the polysilicon layer on the isolation structure for functioning as the electrical fuse device, and a second stack of the dielectric layer, the metal layer and the polysilicon layer on the semiconductor substrate for functioning as a gate of the MOS device.

The construction and method of operation of the invention, however, together with additional objectives and advantages thereof will be best understood from the following description of specific embodiments when read in connection with the accompanying drawings.

DESCRIPTION

Figure 1:
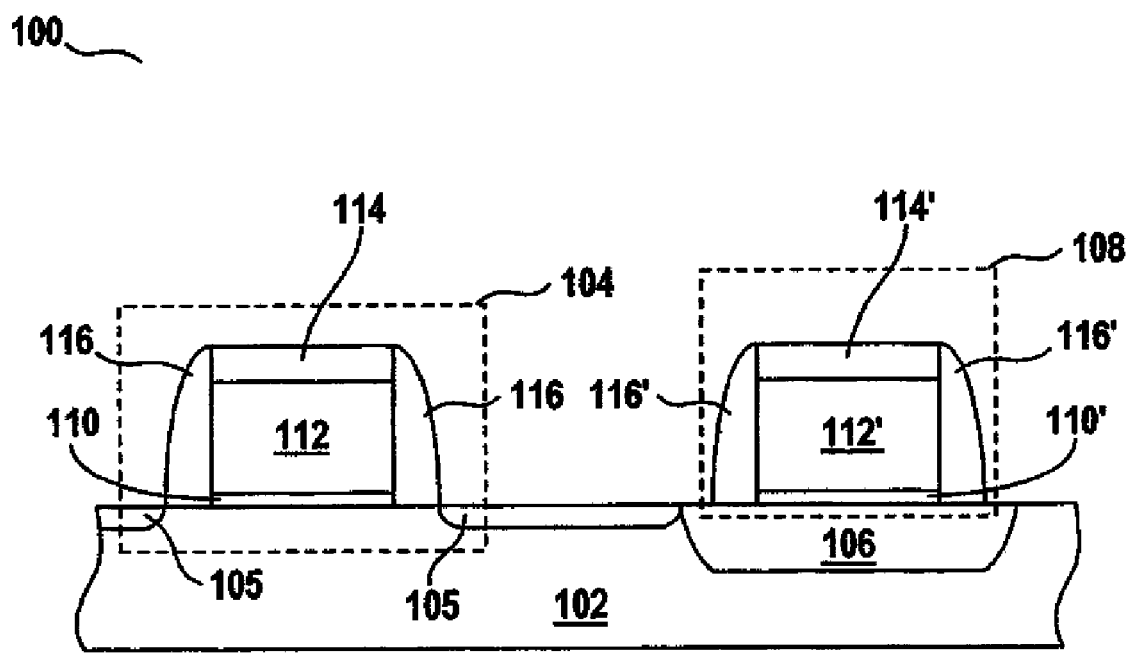
FIG. 1 illustrates a cross sectional view of a conventional electrical fuse device and MOS device.

FIG. 1 illustrates a cross sectional view 100 of a semiconductor structure having a MOS device 104 and a conventional electrical fuse device 108. The MOS device 104 is constructed on top of a semiconductor substrate 102. A gate of the MOS device 104 includes a gate dielectric layer 110, a polysilicon layer 112, and a silicide layer 114. The gate dielectric layer 110 is formed on the semiconductor substrate 102. The polysilicon layer 112 is deposited on the gate dielectric layer 110. The silicide layer 114 is formed on the polysilicon layer 112. Spacers 116 of the MOS device 104 are formed on the sidewalls of the gate dielectric layer 110 and the polysilicon layer 112. Source/drain regions 105 are formed adjacent to the gate dielectric layer 110 of the MOS device 104 in the semiconductor substrate 102.

The conventional electrical fuse device 108 is constructed on top of an isolation structure 106, which is formed on the semiconductor substrate 102. The electrical fuse device 108 includes a stack of layers including a gate oxide layer 110', polysilicon layer 112' and silicide layer 114' in a sequential order. Spacers 116' of the electrical fuse device 108 are formed on the sidewalls of the gate dielectric layer 110', the polysilicon layer 112' and the silicide layer 114'. The electrical fuse device 108 and the gate of the MOS device 104 are formed in the same series of processing steps.

As the semiconductor manufacturing technology advances, it becomes increasingly popular that the MOS device 104 would include a metal structure in its gate structure. This poses a new challenge to the construction of the electrical fuse device 108. Thus, it is desirable to have a method for forming an electrical fuse device and a MOS device with a metal gate structure integrally.

Figure 2A:
FIGS. 2A through 2F illustrate a number of sectional views of semiconductor structures showing a series of processing steps for integrally fabricating an electrical fuse device and a MOS device in accordance with one embodiment of the present invention.

FIGS. 2A through 2F illustrate cross sectional views of semiconductor structures showing the processing steps for fabricating an electrical fuse device in accordance with one embodiment of the present invention. FIG. 2A illustrates a cross-sectional view 202 showing a semiconductor substrate 204, on which an isolation structure 206 is formed. The semiconductor substrate 204 can be made of silicon, germanium, and a combination thereof. The isolation structure 206 can be a shallow trench isolation structure (STI) or a local oxidation of silicon (LOCOS) structure. The STI isolation structure can be formed by steps of trench etching and dielectric material deposition. The LOCOS structure can be formed by locally oxidizing the semiconductor substrate 204.

Figure 2B:
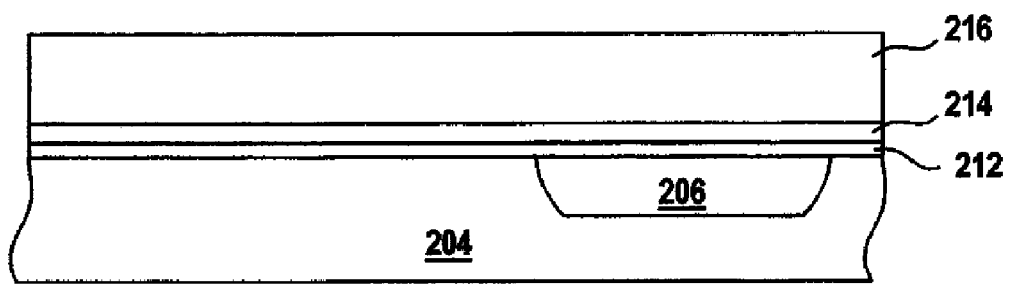

FIG. 2B illustrates a cross-sectional view 210 of a semiconductor structure, which presents a proposed electrical fuse device in process according to the embodiment of the present invention. A gate dielectric layer 212 is formed on the semiconductor substrate 204 and the isolation structure 206. A metal layer 214 is formed on the gate dielectric layer 212. A polysilicon layer 216 is formed on the metal layer 214. The gate dielectric layer can be formed by oxidizing the surface of the semiconductor substrate 204 or performing a chemical vapor deposition (CVD) process. The metal layer 214 can be formed by methods, such as sputtering, CVP, plasma enhanced chemical vapor deposition (PECVD), Atomic Layer Deposition (ALD), etc. Similarly, the polysilicon layer 216 can be formed by methods such as CVD and PECVD. The metal layer 214 may be made of tantalum carbide or tantalum nitride, with a resistivity below about 100 μohm-cm. Other material choices of the metal layer 214 may be pure metal, metal alloy, metal oxide, metal nitride, metal oxynitride, metal silicide, metal carbide and other metal compound.

Figure 2C:
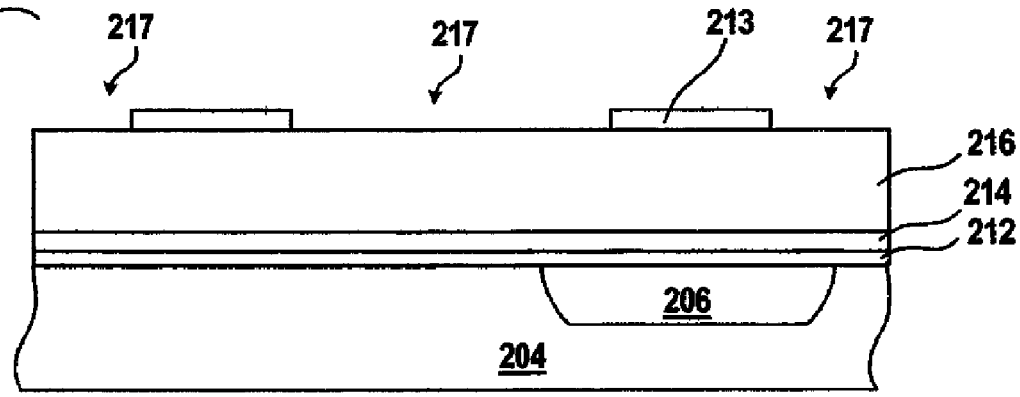

FIG. 2C illustrates a cross-sectional view 211 of a semiconductor structure, which presents a proposed electrical fuse device in process according to the embodiment of the present invention. A photoresist layer 213 with one or more openings 217 is formed on the polysilicon layer 216. An etching process is performed, using the photoresist layer 213 as a shield to define stacked structures beneath the photoresist layer 213. The etching processes can use a wet, dry, or plasma enhanced etching technology. Then, the photoresist layer 213 is removed to provide a semiconductor structure as shown in the cross-sectional view 218 in FIG. 2D.

Figure 2D:
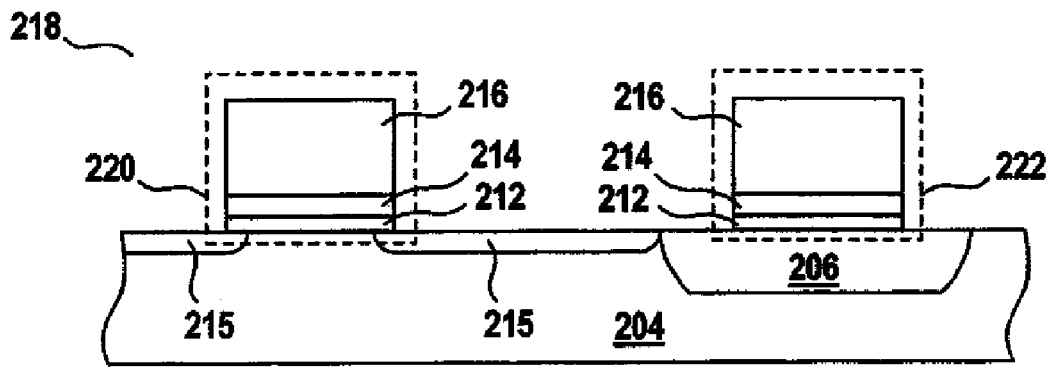

Referring to FIG. 2D, the gate dielectric layer 212, the metal layer 214 and the polysilicon layer 216 are patterned to form a first stack of layers 220 on the substrate 204, and a second stack of layers 222 on top of the isolation structure 206. The first and second stacks of layers include the patterned polysilicon layer 216, metal layer 214 and the gate dielectric layer 212. The first stack of layers 220 functions as a gate of a MOS device, and the second stack of layers 222 functions as an electrical fuse device. An ion implantation process is then performed to form lightly doped source/drain regions 215 adjacent to the gate dielectric layer 212 of the first stack of layers 220 in the semiconductor substrate 204, which is uncovered by the first stack 220 of layers. It is noteworthy that while in this embodiment, the first stack of layers 220 is designed to function as a gate of MOS device; it can be used as a fuse device in other applications, depending on particular design needs.

Figure 2E:
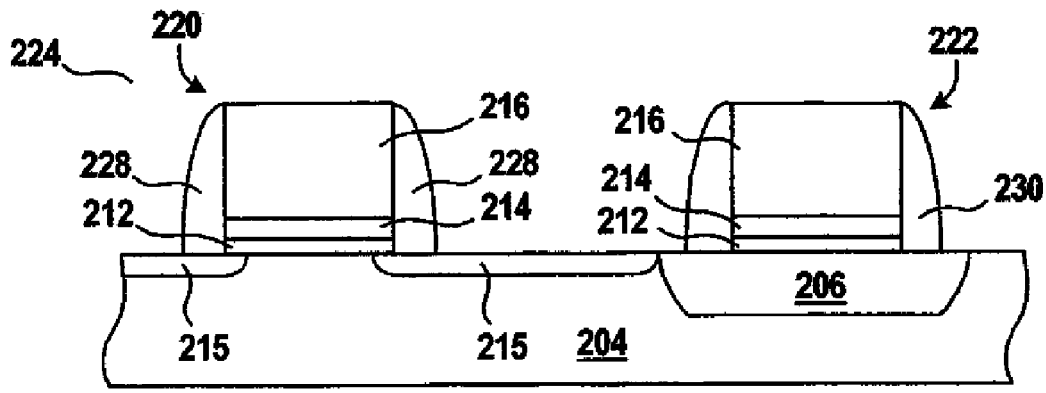
Figure 2F:
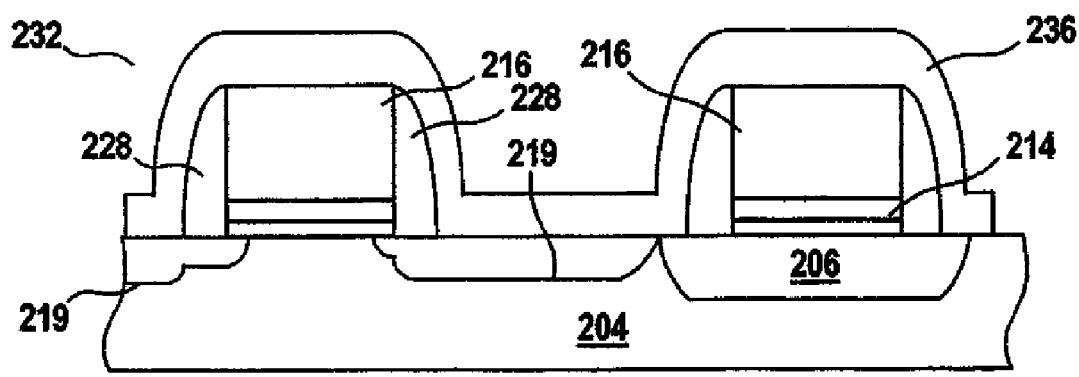

FIG. 2E illustrates a cross-sectional view 224 of a semiconductor structure, which includes the electrical fuse device in process according to one embodiment of the present invention. Spacers 228 are formed on the sidewalls of the gate dielectric layer 212, the metal layer 214 and the polysilicon layer 216 of the first stack 220. Spacers 230 are formed on the sidewalls of the gate dielectric layer 212, the metal layer 214 and the polysilicon layer 216 of the second stack 222. Then, an ion implantation process is performed to form source/drain regions 219 adjacent to the spacers 228 in the semiconductor substrate 204, which is uncovered by the first stack of layers 220 and the spacers 228 as shown in the cross-sectional view 232 in FIG. 2F. The ion implantation process can be followed by an annealing process to drive the implanted impurities further into the semiconductor substrate 204. A cap layer 236 is deposited over the spacers 228, the polysilicon layer 216, the uncovered isolation structure 206, and the uncovered semiconductor substrate 204. The deposition can be a CVD process using silicon-oxide or silicon-nitride based dielectric materials. The cap layer 236 can insulate the polysilicon layer 216 of the first and second stacked structures from a subsequently formed interconnect structures (not shown in this figure). The cap layer 236 can also help to reduce the parasitic capacitance between the metal layer 214 of the electrical fuse device and the interconnect structures.

One advantage of the present invention is that the process of forming the proposed electrical fuse device is compatible with the process of forming a MOS device with a metal gate structure. Therefore, the proposed electrical fuse device can be formed without using extra masks in addition to the masks used in forming the MOS device.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for integrally forming a metal-oxide-semiconductor (MOS) device and an electrical fuse device on a semiconductor substrate, comprising:
    depositing a dielectric layer on the semiconductor substrate;
    depositing a metal layer on the dielectric layer;
    depositing a semiconductor layer on the metal layer; and
    patterning the dielectric layer, the metal layer and the semiconductor layer into a first stack of the dielectric layer, the metal layer and the semiconductor layer for functioning as the electrical fuse device, and a second stack of the dielectric layer, the metal layer and the semiconductor layer for functioning as a gate of the MOS device, simultaneously.

2. The method of claim 1, further comprising forming an isolation structure underlying the first stack of dielectric layer, metal layer and the semiconductor layer in the semiconductor substrate.

3. The method of claim 1, wherein the metal layer comprises pure metal, metal alloy, metal oxide, metal nitride, metal silicide, or combinations thereof.

4. The method of claim 1, wherein the metal layer comprises tantalum carbide or tantalum nitride.

5. The method of claim 1, wherein the metal layer has a resistivity below about 100 μohm-cm.

6. The method of claim 1, further comprising implanting ions into the semiconductor substrate uncovered by the second stack of the dielectric layer, the metal layer and the semiconductor layer for forming one or more lightly doped source/drain regions adjacent thereto in the semiconductor substrate.

7. The method of claim 6, further comprising forming first spacers on sidewalls of the first stack of the dielectric layer, the metal layer and the semiconductor layer, and second spacers on sidewalls of the second stack of the dielectric layer, the metal layer and the semiconductor layer.

8. The method of clam 7, further comprising implanting ions into the semiconductor substrate uncovered by the second stack of the dielectric layer, the metal layer and the semiconductor layer and the second spacers for forming one or more source/drain regions adjacent to the second spacers in the semiconductor substrate.

9. The method of claim 8, further comprising forming a cap layer over the first spacers, the first stack of the dielectric layer, the metal layer and the semiconductor layer, the second spacers, and the second stack of the dielectric layer, the metal layer and the semiconductor layer.

10. The method of claim 9, wherein the cap layer reduces parasitic capacitance between the metal layer of the first stack and a subsequently formed interconnect structures.

11. A method for integrally forming a metal-oxide-semiconductor (MOS) device and an electrical fuse device on a semiconductor substrate, comprising:

forming an isolation structure on the semiconductor substrate;

depositing a dielectric layer over the isolation structure and the semiconductor substrate;

depositing a metal layer on the dielectric layer;

depositing a polysilicon layer on the metal layer; and patterning the dielectric layer, the metal layer and the polysilicon layer into a first stack of the dielectric layer, the metal layer and the polysilicon layer on the isolation structure, and a second stack of the dielectric layer, the metal layer and the polysilicon layer on the semiconductor substrate;

wherein the first stack overlying the isolation structure functions as the electrical fuse device, and the second stack overlying the semiconductor substrate functions as a gate of the MOS device.

12. The method of claim 11, further comprising implanting ions into the semiconductor substrate uncovered by the second stack of the dielectric layer, the metal layer and the polysilicon layer for forming one or more lightly doped source/drain regions adjacent thereto in the semiconductor substrate.

13. The method of claim 12, further comprising forming first spacers on sidewalls of the first stack of the dielectric layer, the metal layer and the polysilicon layer, and second spacers on sidewalls of the second stack of the dielectric layer, the metal layer and the polysilicon layer.

14. The method of claim 13, further comprising implanting ions into the semiconductor substrate uncovered by the second stack of the dielectric layer, the metal layer and the polysilicon layer and the second spacers for forming one or more source/drain regions adjacent to the second spacers in the semiconductor substrate.

* * * * *